United States Patent
Knoedgen et al.

(10) Patent No.: US 10,333,408 B1
(45) Date of Patent: Jun. 25, 2019

(54) COMPENSATION OF LEVEL-SHIFT CAPACITANCE

(71) Applicant: Dialog Semiconductor (UK) Limited, London (GB)

(72) Inventors: Horst Knoedgen, Munich (DE); Christoph N. Nagl, Graz (AT); Nebojsa Jelaca, Graz (AT); Frank Kronmueller, Neudenau (DE); Ambreesh Bhattad, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/963,633

(22) Filed: Apr. 26, 2018

(51) Int. Cl.
  *H02M 3/158* (2006.01)
  *H02M 1/088* (2006.01)
  *H03K 3/037* (2006.01)

(52) U.S. Cl.
  CPC ......... *H02M 3/1588* (2013.01); *H02M 1/088* (2013.01); *H02M 3/158* (2013.01); *H02M 3/1584* (2013.01); *H03K 3/037* (2013.01)

(58) Field of Classification Search
  CPC .... H02M 3/1588; H02M 3/158; H02M 3/157; H02M 3/1584; H02M 1/088
  See application file for complete search history.

(56) References Cited

U.S. PATENT DOCUMENTS

| | | | | |
|---|---|---|---|---|
| 5,552,731 A * | 9/1996 | Diazzi | .................. | H03K 17/161 327/109 |
| 5,742,196 A * | 4/1998 | Fronen | .................. | H03K 5/003 327/108 |
| 6,538,481 B1 * | 3/2003 | Suetsugu | .............. | H02M 7/538 327/109 |
| 9,991,796 B2 * | 6/2018 | Sugahara | .............. | H02M 3/158 |
| 2017/0302178 A1 * | 10/2017 | Bandyopadhyay | ... | H02M 3/158 |

* cited by examiner

*Primary Examiner* — Kyle J Moody
(74) *Attorney, Agent, or Firm* — Saile Ackerman LLC; Stephen B. Ackerman

(57) ABSTRACT

A half bridge circuit and a method for its operation are presented. The half bridge circuit contains a high-side switch, a latch for providing a drive signal for the high-side switch, a first transistor device acting as a level shifter for shifting a voltage level at an input of the latch. The first transistor device is coupled between a supply voltage level and ground, and the voltage level at the input of the latch is shifted in accordance with a current that flows through the first transistor device. A second transistor device is coupled between the supply voltage level and ground, in parallel to the first transistor device. There is a current mirror for mirroring a current that flows through the second transistor device. There is a circuit path for feeding the mirrored current to an intermediate node between the supply voltage level and the first transistor device.

18 Claims, 8 Drawing Sheets

US 10,333,408 B1

COMPENSATION OF LEVEL-SHIFT CAPACITANCE

TECHNICAL FIELD

This disclosure relates to half bridge circuits (e.g., switching mode power converters) and methods of operating half bridge circuits. This disclosure particularly relates to compensation of level shift capacitances in half bridge circuits. This disclosure is particularly applicable to half bridge circuits that include Gallium Nitride (GaN) transistor devices, such as GaN High Electron Mobility Transistors (HEMTs), as level shifters.

BACKGROUND

Half bridge circuits typically use level shifters for triggering drive signals (e.g., SET and RESET (RST)) for their high-side switches. Circuit studies using level shifters show that current spikes due to parasitic capacitances of the level shifters are considerable and that rise and fall times are quite long. This could lead to fault triggering of the high-side switch.

This issue is particularly relevant for half bridge circuits using GaN transistors as level shifters. The GaN technology for transistors allows for much higher operation frequencies and is more sensitive to short transients. Parasitic capacitors of GaN transistors to ground may generate relevant current spikes, which might cause fault triggering of the half bridge circuit.

SUMMARY

Thus, there is a need for half bridge circuits (e.g., switching mode power converters) that are less affected by parasitic capacitances of their level shifters and that avoid fault triggering. There is further need for methods of operating such half bridge circuits. In view of some or all of these needs, the present disclosure proposes a half bridge circuit and a method of operating a half bridge circuit, having the features of the respective independent claims. An aspect of the disclosure relates to a half bridge circuit. The half bridge circuit may be an example of a half bridge circuit. The half bridge circuit may include a high-side switch. The high-side switch may be coupled between an input voltage level and an output node of the switching power converter. The half bridge circuit may further include a latch (set-reset- (RS-) latch) for providing a drive signal for the high-side switch. The half bridge circuit may further include a first transistor device acting as a level shifter for shifting a voltage level at an input of the latch. The first transistor device may intermittently shift the voltage level at the input of the latch. Shifting the voltage level at the input of the latch may correspond to lowering that voltage level. The first transistor device may be coupled between a supply voltage level and ground. The voltage level at the input of the latch may be shifted in accordance with a current that flows through the first transistor device. The first transistor device may shift the voltage level at the input of the latch in accordance with a SET or RST (reset) control signal. The half bridge circuit may further include a second transistor device coupled between the supply voltage level and ground, in parallel to the first transistor device. The half bridge circuit may further include a current mirror for mirroring a current that flows through the second transistor device. The half bridge circuit may yet further include a circuit path for feeding the mirrored current to an intermediate node between the supply voltage level and the first transistor device. Feeding the mirrored current to the intermediate node may compensate for any parasitic current flowing through the first transistor device.

Configured as proposed, the half bridge circuit reduces the influence of the parasitic capacitance of the first transistor device, which acts as a level shifter, by introducing an additional level shifter, i.e., the second transistor device. The additional level-shifter (e.g., having nearly identical structure and parasitic capacitance to ground as the first transistor device) will generate a current caused by a voltage change over time ($I_C = C \times dV/dt$, where C is the parasitic capacitance). In the next stage the current is mirrored and fed to the appropriate control signal path, i.e., to the intermediate node. The mirrored current will then compensate the parasitic current in the main path. Thus, by feeding the mirrored current to the intermediate node, the impact of the parasitic current flowing through the first transistor device can be reduced or altogether eliminated. Thereby, a voltage drop at the input of the latch that would otherwise result from this parasitic current can be reduced or altogether avoided, whereby fault triggers of the latch (and accordingly, of the high-side switch) can be prevented. This allows the half bridge circuit to operate with much faster frequencies and transients, improves the noise immunity of the half bridge circuit, and further reduces pulse currents for the set and reset signals in the half bridge circuit. In consequence, the proposed configuration enables robust high-voltage and high-frequency circuit design of half bridges (e.g., switching mode power converters) containing level shifters.

In some embodiments, the second transistor device may have the same size as the first transistor device. The second transistor device may be a replica of the first transistor device with scaling factor one. Accordingly, a parasitic capacitance of the first transistor device will be equal to a parasitic capacitance of the second transistor device. Further, the current mirror may have a mirror ratio greater than or equal to one. Alternatively, the mirror ratio of the current mirror multiplied by a ratio of a parasitic capacitance of the second transistor device over a parasitic capacitance of the first transistor device may be greater than or equal to one. This allows for generation of a mirrored current that is sufficient for cancelling the parasitic current and thereby avoid fault triggering of the latch.

In some embodiments, the second transistor device may be driven to be switched OFF. For example, a gate (gate terminal) of the second transistor device may be coupled to ground (or any other voltage below the threshold voltage). Thereby, unnecessary current losses at the second transistor device can be avoided, while the current flowing through the parasitic capacitance of the second transistor device can still be used for generation of a mirrored current that is sufficient for cancelling the parasitic current and thereby avoid fault triggering of the latch.

In some embodiments, the half bridge circuit may further include an impedance (e.g., resistance, pull-up resistance) coupled between the supply voltage level and the intermediate node between the supply voltage level and the first transistor device. The impedance may be provided for generating a voltage drop at the input of the latch in accordance with (e.g., in dependence on) the current flowing through the first transistor device. The intermediate node may be coupled to the input of the latch.

In some embodiments, the half bridge circuit may further include a pull-up current mirror that includes a pair of gate-connected transistors. A first transistor of the pair may be coupled between the supply voltage level and the intermediate node. A second transistor of the pair may be coupled in series with a current source between the supply voltage level and an output node of the half bridge circuit. A second intermediate node between the second transistor of the pair and the current source may be coupled to the input of the latch. The pull-up current mirror may be provided for generating a voltage drop at the input of the latch in accordance with (e.g., in dependence on) the current flowing through the first transistor device.

In some embodiments, the current mirror may be a first current mirror for mirroring the current that flows through the second transistor device in case of a positive polarity of that current. The first current mirror may include PMOS transistors. The circuit path may be a first circuit path for feeding the mirrored current of the first current mirror to the intermediate node between the supply voltage level and the first transistor device. The half bridge circuit may further include a second current mirror for mirroring the current that flows through the second transistor device in case of a negative polarity of that current. The second current mirror may include NMOS transistors. The half bridge circuit may further include a second circuit path for feeding the mirrored current of the second current mirror to the intermediate node between the supply voltage level and the first transistor device. The half bridge circuit may yet further include a switching means for selectively activating the first current mirror or the second current mirror, depending on the polarity of the current that flows through the second transistor device. The switching means may include a pair of transistors, for example one PMOS transistor and one NMOS transistor. A source (source terminal) of one of them may be coupled to a drain (drain terminal) of the other one of them. The source and the drain may be coupled to a supply voltage side of the second transistor device. Gates (gate terminals) of the transistors of the switching means may be coupled to an output node of the half bridge circuit through a reference voltage source. A voltage that is applied by the reference voltage source may correspond to half the supply voltage level. The first current mirror, the switching means, and the second current mirror may be coupled in series between the supply voltage level and the output node. Thereby, both positive polarity parasitic currents and negative polarity parasitic currents of the first transistor device can be compensated for.

In some embodiments, the half bridge circuit may further include a third transistor device acting as a level shifter for shifting a voltage level at a second input of the latch. The third transistor device may be coupled between the supply voltage level and ground. The voltage level at the second input of the latch may be shifted in accordance with a current that flows through the third transistor device. The current mirror may comprise two output transistors. Each of these two output transistors may conduct the mirrored current. The circuit path may be coupled to a first one of the output transistors. The half bridge circuit may further include a second circuit path for feeding the mirrored current to a third intermediate node between the supply voltage level and the third transistor device. The second circuit path may be coupled to a second one of the output transistors. Thereby, a parasitic current flowing through a further level shifter (e.g., for a RST (reset) signal) can be compensated for.

In some embodiments, the half bridge circuit may further include a filtering block for applying common mode rejection and/or filtering to the voltage levels at the two inputs of the latch. Thereby, the risk of fault triggering may be further reduced.

Another aspect of the disclosure relates to a method of operating a half bridge circuit. The half bridge circuit may be an example of a half bridge circuit. The method may include generating, using a latch, a drive signal for a high-side switch of the half bridge circuit. The method may further include shifting, using a first transistor device acting as a level shifter, a voltage level at an input of the latch, in accordance with a current that flows through the first transistor device. The first transistor device may be coupled between a supply voltage level and ground. The method may further include providing a second transistor device coupled between the supply voltage level and ground, in parallel to the first transistor device. The method may further include mirroring, using a current mirror, a current that flows through the second transistor device. The method may yet further include feeding the mirrored current to an intermediate node between the supply voltage level and the first transistor device.

In some embodiments, the second transistor device may have the same size as the first transistor device. Further, the current mirror may have a mirror ratio greater than or equal to one. Alternatively, the mirror ratio of the current mirror multiplied by a ratio of a parasitic capacitance of the second transistor device over a parasitic capacitance of the first transistor device may be greater than or equal to one.

In some embodiments, the method may further include driving the second transistor device to be switched OFF.

In some embodiments, the method may further include coupling an impedance between the supply voltage level and the intermediate node between the supply voltage level and the first transistor device. The method may yet further include coupling the intermediate node to the input of the latch.

In some embodiments, the method may further include providing a pull-up current mirror that includes a pair of gate-connected transistors. A first transistor of the pair may be coupled between the supply voltage level and the intermediate node. A second transistor of the pair may be coupled in series with a current source between the supply voltage level and an output node of the half bridge circuit. The method may further include coupling a second intermediate node between the second transistor of the pair and the current source to the input of the latch.

In some embodiments, the current mirror may be provided as a first current mirror for mirroring the current that flows through the second transistor device in case of a positive polarity of that current. The circuit path may be provided as a first circuit path for feeding the mirrored current of the first current mirror to the intermediate node between the supply voltage level and the first transistor device. The method may further include providing a second current mirror for mirroring the current that flows through the second transistor device in case of a negative polarity of that current. The method may further include providing a second circuit path for feeding the mirrored current of the second current mirror to the intermediate node between the supply voltage level and the first transistor device. The method may yet further include selectively activating the first current mirror or the second current mirror, depending on the polarity (direction) of the current that flows through the second transistor device.

In some embodiments, the current mirror may include two output transistors. Each of the output transistors may conduct the mirrored current. The method may further include shifting, using a third transistor device acting as a level shifter, a voltage level at a second input of the latch, in accordance with a current that flows through the third transistor device. The third transistor device may be coupled between the supply voltage level and ground. The method may further include coupling the circuit path to a first one of the output transistors. The method may further include providing a second circuit path for feeding the mirrored current to a third intermediate node between the supply voltage level and the third transistor device. The method may yet further include coupling the second circuit path to a second one of the output transistors.

In some embodiments, the method may further include applying, using a filtering block, common mode rejection and/or filtering to the voltage levels at the two inputs of the latch.

Notably, the method may be applied to any of the circuits described above, for example as a method of operating these circuits. In addition to steps for operating these circuits, the method may further include steps for providing or arranging any, some, or all of the elements of these circuits and/or steps for coupling or connecting respective elements of these circuits.

Moreover, it will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner (e.g., indirectly). Notably, one example of being coupled is being connected.

While the above aspects and embodiments make reference to a half bridge circuit, the present disclosure is to be understood to likewise relate to switching mode power converters with the aforementioned features.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates an example of a half bridge circuit to which embodiments of the disclosure may be applied, FIG. 2 schematically illustrates an example of a half bridge circuit according to embodiments of the disclosure.

DESCRIPTION

As indicated above, identical or like reference numbers in the disclosure indicate identical or like elements, and repeated description thereof may be omitted for reasons of conciseness.

As noted above, half bridge circuits (e.g., switching mode power converters) may suffer from fault triggering caused by parasitic currents flowing through the parasitic capacitances of level shifters. Possible approaches for avoiding this fault triggering include reducing the parasitic capacitances, decreasing the voltage change across the parasitic capacitances, and increasing the time for change the voltage across the parasitic capacitances (i.e., decreasing the change rate).

Parasitic capacitance at any node can be reduced by shielding that node with floating metal, which would reduce the parasitic capacitance by putting capacitances in series. The voltage change can be reduced by coupling the sensitive node with floating metal. In this case, the floating metal would form a capacitor divider network between the sensitive node and the AC ground node. However, these approaches typically require a significant amount of additional material and circuit footprint and cannot fully avoid parasitic currents.

Figure 1:
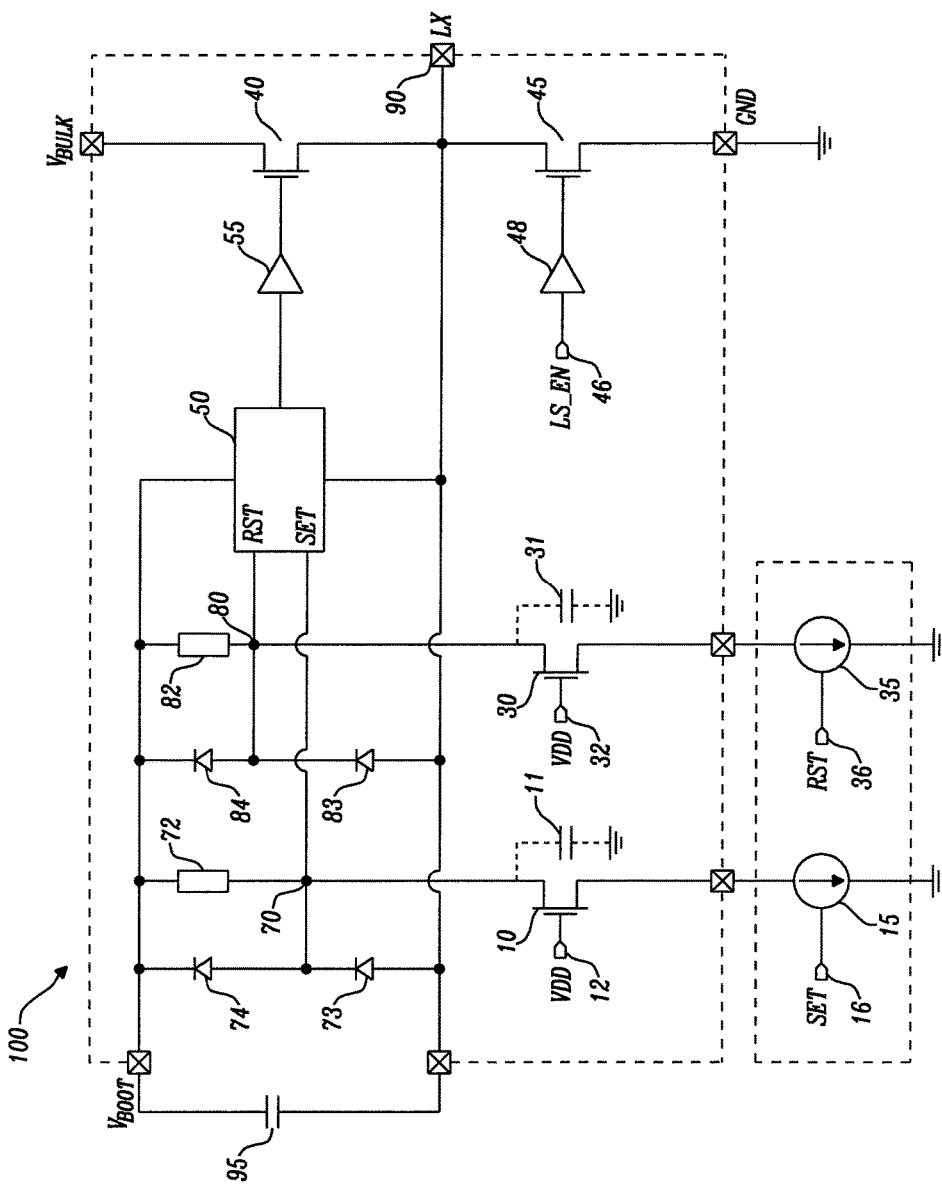

FIG. 1 schematically illustrates an example of a half bridge circuit 100 (e.g., high-side gate driver structure) to which embodiments of the disclosure may be applied. The half bridge circuit 100 may be part of, or correspond to, a switching mode power converter. In the remainder of this disclosure, the terms switching mode power converter and half bridge circuit may be used interchangeably.

The half bridge circuit 100 comprises a high-side switch 40 (e.g., a transistor device). The high-side switch 40 is coupled between an input voltage level ($V_{BULK}$) of the half bridge circuit 100 and an output node (LX node) 90 of the half bridge circuit 100. The high-side switch 40 is driven by a latch 50 that provides a drive signal for the high-side switch 40. The latch 50 may be coupled to a gate (gate terminal) of the high-side switch 40 via an amplifier 55, for example. The latch 50 has two inputs (SET, RST) for receiving triggers for a set (SET) drive signal and a reset (RST) drive signal for the high-side switch 40. On occurrence of a voltage drop at either input, a respective drive signal (e.g., a respective voltage level) will be output to the high-side switch 40 for setting or resetting the high-side switch 40. These voltage drops are generated by respective level shifters, one for the SET signal and one for the RST signal.

Accordingly, the half bridge circuit 100 comprises a first transistor device 10 acting as a level shifter for (intermittently) shifting (e.g., lowering) the voltage level at an input (first input, e.g., the SET input) of the latch 50. The first transistor device 10 has a parasitic capacitance ($C_{par,1}$) 11. The first transistor device 10 is coupled between a supply voltage level ($V_{BOOT}$) and ground. A gate (gate terminal) 12 of the first transistor device 10 may be coupled to a fixed voltage level (e.g., VDD). This first transistor device 10 is used to shift the voltage level at the input of the latch 50 in accordance with a current that flows through the first transistor device 10. To this end, the half bridge circuit 100 may comprise an impedance 72 (e.g., resistance, or pull-up resistance) and a current source 15 that are coupled in series with the first transistor device 10 between the supply voltage level and ground. These elements may be coupled between the supply voltage level and ground in the order impedance 72, first transistor device 10, current source 15. A (first) intermediate node 70 between the impedance 72 and the first transistor device 10 may be coupled to the input of the latch 50. On activation of the current source 15 by the SET signal 16, a current will flow through the first transistor device 10 and the impedance 72, which will lower the voltage level at the intermediate node 70, and thereby, at the input of the latch 50. Thus, the impedance 72 may be said to generate a voltage drop at the input of the latch in accordance with (e.g., in dependence on) the current flowing through the first transistor device 10. This voltage drop will be detected by the latch 50, which will then output the appropriate drive signal (e.g., the SET drive signal) for the high-side switch 40. Thus, the first transistor device 10 may be said to shift the voltage level at the input of the latch 50 in accordance with the SET control signal 16. The half bridge circuit 100 may further comprise a string of diodes 73, 74 (e.g., a pair of diodes) that are connected, in their conducting direction, between the output node 90 and the supply voltage level. An intermediate node within the string of diodes (e.g., between the pair of diodes 73, 74) may be connected to the aforementioned intermediate node 70.

The half bridge circuit 100 comprises an analogous structure for the other input (second input, e.g., RST input) of the latch 50. Accordingly, the half bridge circuit 100 comprises another set of a transistor device 30 with a gate (gate terminal) 32, an impedance 82, a current source 35, and a string (e.g., pair) of diodes 83, 84, that are configured in the same manner as described above, with the exception that an intermediate node 80 between the other impedance 82 and the other transistor device 30 is coupled to the other input of the latch 50, and that the other current source 35 is controlled by the RST signal 36. The other transistor device 30 may be said to act as a level shifter for the other input of the latch 50. The other transistor device 30 has a parasitic capacitance ($C_{par,3}$) 31.

The current sources 15, 35 and control therefor may be implemented in the CMOS domain, for example. The transistor devices 10, 30 that act as level shifters may be implemented in the GaN domain, for example.

The half bridge circuit 100 further comprises a low-side switch 45. The low-side switch 45 may be driven by a separate control signal LS_EN 46, for example via an amplifier 48.

The half bridge circuit 100 may further comprise a capacitance 95 coupled between the supply voltage level and the output node 90 of the half bridge circuit 100.

To summarize, the half bridge circuit 100 comprises two level shifters (e.g., GaN level shifters) for the set (SET) and reset (RST) signal for the latch 50 (set-reset- (RS-) latch). The latch 50 (as part of, or implementing, a high-side gate driver) is controlled by applying short current pulses in the CMOS domain, which causes respective voltage drops on the pull-up resistors (impedances 72, 82) and triggers the latch 50.

A basic problem in the half bridge circuit 100 results from the parasitic capacitors of the level shifters. The parasitic capacitance ($C_{par}$) for each level shifter (e.g., transistor device 10, transistor device 30) consists of the output capacitances of the level shift transistors and also the bonding capacitance of the package itself. During voltage transients of the output (LX) node 90 the capacitive current $I_C = C_{par} \times dV/dt$ on a given level shifter might cause a relevant voltage drop on the respective pull-up resistor and thus cause a false trigger of the latch 50.

Figure 2:
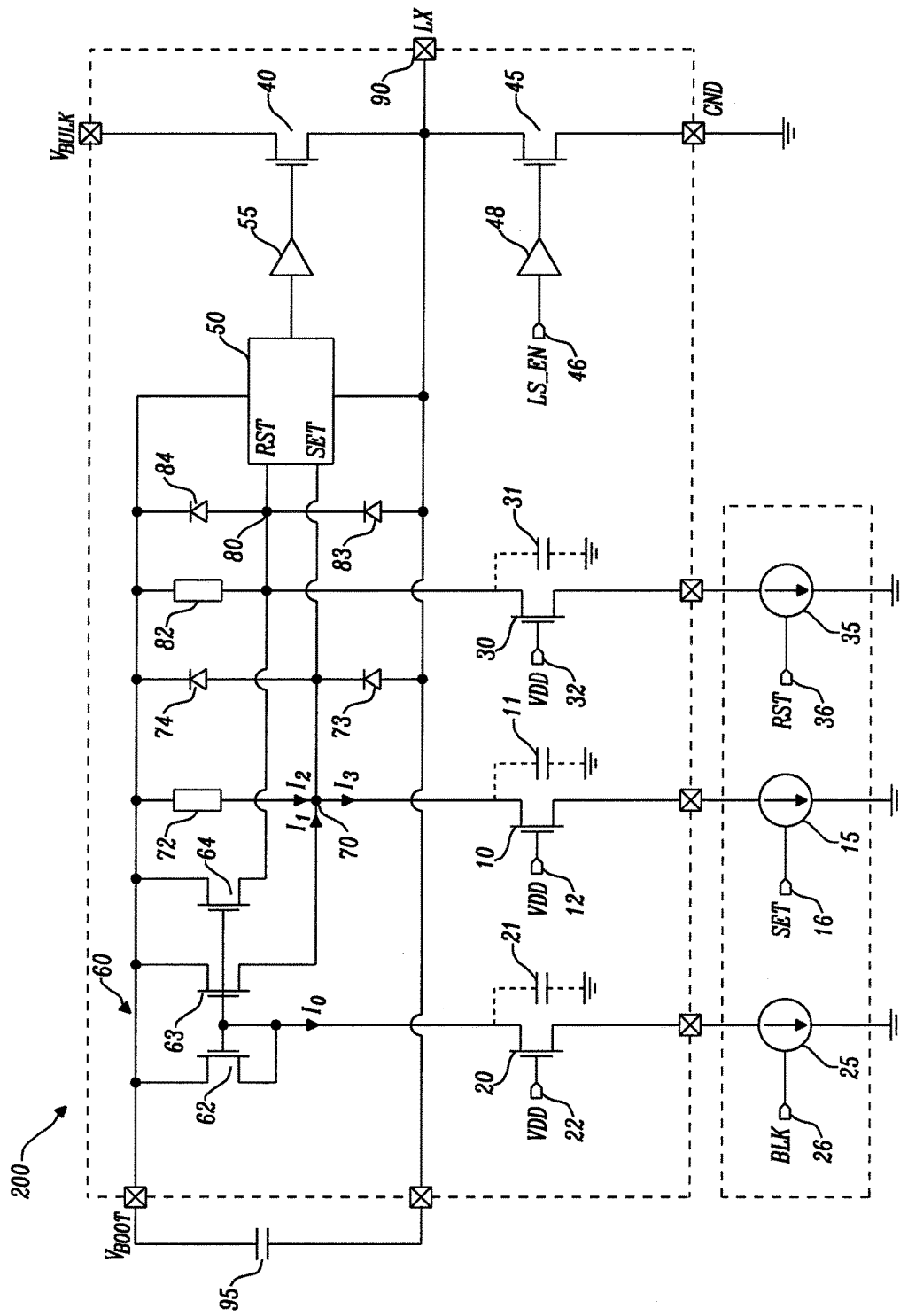

FIG. 2 schematically illustrates an example of a half bridge circuit 200 according to embodiments of the disclosure. This half bridge circuit 200 reduces the effect of the parasitic capacitive current and false triggering of the latch 50 due to the voltage change on the output node (common half bridge LX node). The figure shows the basic implementation of the complete circuit with current sinks, level shifters, compensation circuit, half-bridge logic, and half-bridge.

Compensation of the parasitic current for the set control signal path will be described first. To this end, the half bridge circuit 200 comprises, compared to the half bridge circuit 100 of FIG. 1, a second transistor device 20 coupled between the supply voltage level and ground, in parallel to the first transistor device 10. The second transistor device 20 may be driven to be switched off. To this end, a gate (gate terminal) 22 may be connected to ground, for example. Alternatively, the second transistor device 20 may be driven with the same drive signal as the first transistor device 10. The second transistor device 20 has a parasitic capacitance ($C_{par,2}$) 21. Further, the half bridge circuit 200 comprises a current source 25 coupled between the second transistor device 20 and ground. This current source 25, which may be controlled by a blank (BLK) control signal 26, may be identical in size and structure to the current source 15 that is coupled between the first transistor device 10 and ground.

The second transistor device 20 may be a replica of the first transistor device 10. The scaling factor may be one, for example, to ensure that the parasitic capacitance of the second transistor device 20 equals the parasitic capacitance of the first transistor device 10. That is, the second transistor device 20 may have the same size (dimensions) as the first transistor device 10. The half bridge circuit 200 further comprises a current mirror 60 for mirroring a current that flows through the second transistor device 20. The current mirror 60 may include an input transistor 62 and one or more output transistors 63, 64. The current mirror 60 may have a mirror ratio m greater than or equal to one. Thereby, it can be ensured that the mirrored current is sufficient for cancelling the impact of the parasitic current of the first transistor device 10. A general requirement for being able to cancel the impact of the parasitic current of the first transistor device 10 is that the mirror ratio m of the current mirror 60 multiplied by a ratio $C_{par,2}/C_{par,1}$ of the parasitic capacitance $C_{par,2}$ of the second transistor device 20 over the parasitic capacitance $C_{par,1}$ of the first transistor device 10 is greater than or equal to one. To use the mirrored current for compensating the parasitic current of the first transistor device 10 in the set control path, the half bridge circuit 200 comprises a (first) circuit path for feeding the mirrored current to the intermediate node 70 between the supply voltage level and the first transistor device 10. As noted above, this intermediate node 70 is coupled to the input (first input, SET input) of the latch 50.

Broadly speaking, the idea is to generate, as the current $I_1$ in FIG. 2, a mirrored current which is equal and negative to the parasitic current $I_3$ through the first transistor device 10. According to Kirchhoff's law the sum of the all currents in the intermediate node 70 is zero, $I_1 + I_2 + I_3 = 0$. By generating the current $I_1 = -I_3$ and feeding it to the intermediate node 70, it follows that the current $I_2$ flowing through the pull-up resistor 72 is zero, $I_2 = 0$. Then, if there is no current on the pull-up resistor 71, there is also no voltage drop, and the input of the latch 50 is not affected by the parasitic current $I_3$ through the first transistor device 10. In order to generate this negative current $I_1$ which must have same or greater value (magnitude) as $I_3$, the second transistor device 20 (which may be identical in size and structure to the first transistor device 10) with appropriate current source structure is added to the circuit and the output of the current mirror 60 is connected to the input of the latch 50 (i.e., to the intermediate node 70). In case of a voltage change at the output node 90 (LX node), the capacitive current $I_3 = C_{par,1} \times dV_{LX}/dt$ is generated in the circuit string of the first transistor device 10 (set level shifter string). Assuming that the parasitic capacitance $C_{par,2}$ of the second transistor device 20 is equal to the parasitic capacitance $C_{par,1}$ of the first transistor device 10, the current $I_0 = C_{par,2} \times dV_{LX}/dt$ is generated in the additional level shifter (i.e., the second transistor device 20) for compensation. The current $I_0$ is mirrored to $I_1$ with negative sign to $I_3$, so that $I_3 = -I_1$ and the resulting current $I_2$ for the pull-up resistor 72 is zero. The amount of the compensating capacitive current in the set control path depends on the values of $C_{par,2}$ and $C_{par,1}$. As noted above, it may be desirable to have the parasitic capacitances $C_{par,1}$ and $C_{par,2}$ equal each other, which means that the two level shifters (the first transistor device 10 and the second transistor device 20) should be made symmetrical. Practically this may not be the case and the values of the parasitic capacitances may be not equal. A greater capacitance value $C_{par,2}$ will also sink a greater current and in order to reach better compensation, and the mirror ratio m of the current mirror may be chosen to be higher than or equal to one. Referring to FIG. 2, this would mean that the mirror ratio m of the current mirror 60 for the compensation current $I_1$ which is given by $I_0:I_1=1:m$, where $I_0$ is the current flowing through the input transistor 62 of the current mirror 60 and $I_1$ is the current flowing through the output transistor 63 of the current mirror 60, requires m≥1, or theoretically, m≥($C_{par,1}/C_{par,2}$).

The half bridge circuit 200 may also comprise a compensation structure for the other input (second input, e.g., RST input) of the latch 50. As noted above, the half bridge circuit may comprise a (third) transistor device 30 acting as a level shifter for shifting a voltage level at a second input (e.g., RST input) of the latch 50. The third transistor device 30 is coupled between the supply voltage level and ground. A (third) intermediate node 80 between the supply voltage level and the third transistor device 30 is coupled to the second input of the latch 50. The voltage level at the second input of the latch is shifted in accordance with a current that flows through the third transistor device 30. To cancel the parasitic current flowing through the third transistor device 30 that might otherwise cause fault triggers of the RST drive signal for the high-side switch 40, a copy of the mirrored current $I_1$ is also fed to the (third) intermediate node 80. To do so, the current mirror 60 comprises the input transistor 62 as well as two output transistors 63, 64, where each of the output transistors conducts the mirrored current $I_1$. The two output transistors 63, 64 may be identical in size and structure. The aforementioned (first) circuit path is coupled to a first one of the output transistors (transistor 63 in the example of FIG. 2) to provide the mirrored current $I_1$ to the (first) intermediate node 70 between the supply voltage level and the first transistor device 10. In addition to the (first) circuit path, the half bridge circuit 200 further comprises a second circuit path for feeding the mirrored current $I_1$ to the (third) intermediate node 80 between the supply voltage level and the third transistor device 30. This second circuit path is coupled to a second one of the output transistors (transistor 64 in the example of FIG. 2). Assuming that the first and third transistor devices 10, 30 are identical, this will also cancel the influence on the latch 50 of the parasitic current flowing through the third transistor device 30.

Figure 3A:
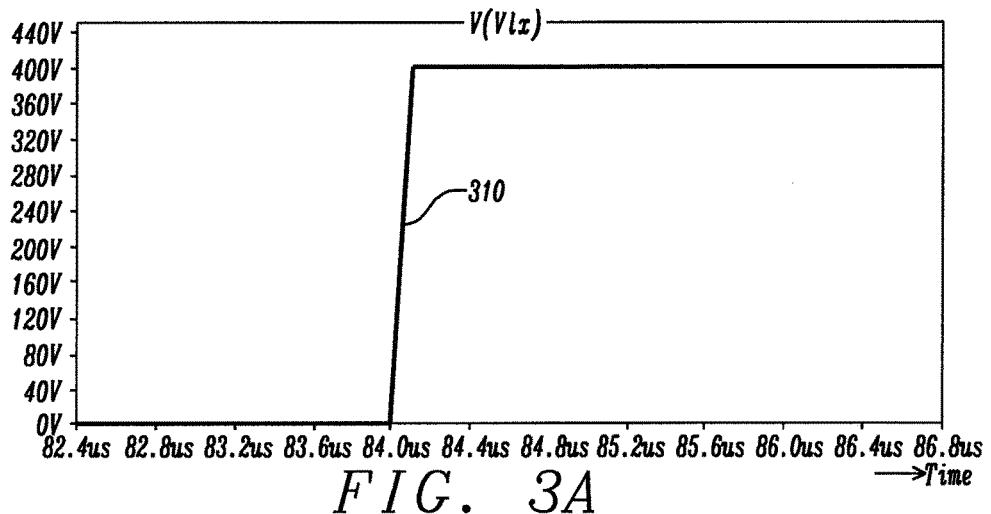
FIGS. 3A, 3B and 3C are diagrams schematically illustrating an example of the impact of a voltage change at an output node of the half bridge circuit of FIG. 1, FIGS. 4A, 4B and 4C are diagrams schematically illustrating an example of the impact of a voltage change at an output node of the half bridge circuit of FIG. 2, FIG. 5 schematically illustrates another example of a half bridge circuit according to embodiments of the disclosure, FIG. 6 schematically illustrates another example of a half bridge circuit according to embodiments of the disclosure, FIG. 7 schematically illustrates yet another example of a half bridge circuit according to embodiments of the disclosure.
Figure 3B:
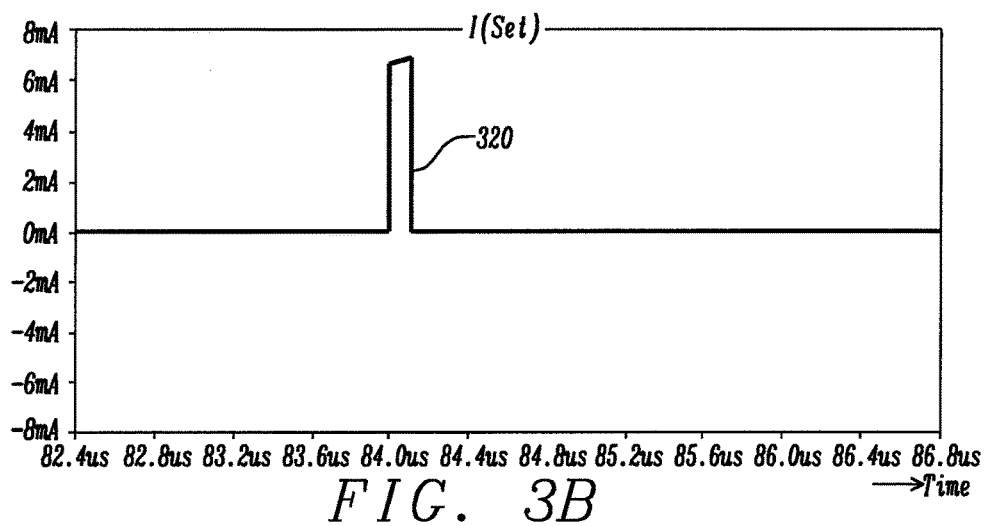
Figure 3C:
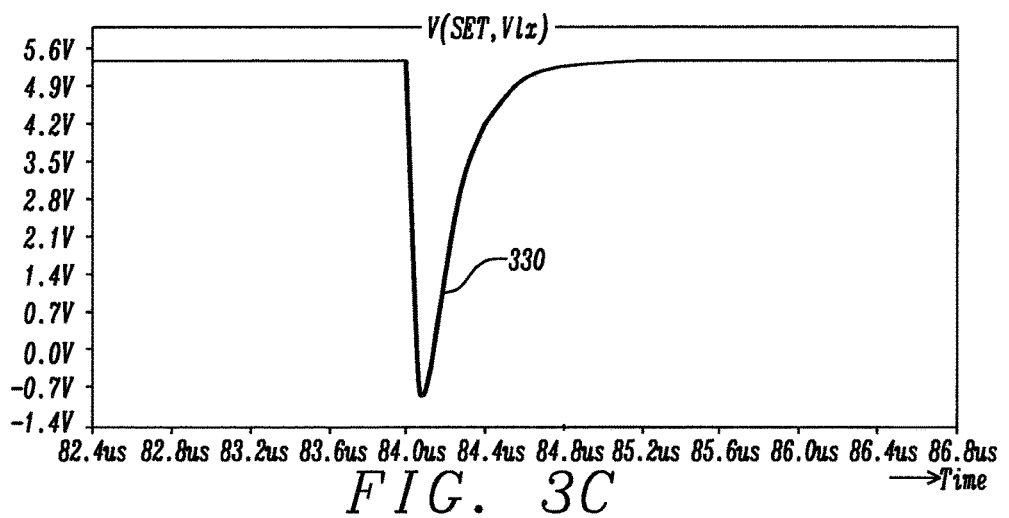

FIGS. 3A, 3B and 3C are diagrams schematically illustrating an example of the impact of a voltage change at the output node of the half bridge circuit 100 of FIG. 1. In more detail, FIGS. 3A, 3B and 3C show the simulation results for the SET control signal of the half bridge circuit 100 with parasitic capacitance of 0.1 pF and a voltage slope of 400 V/100 ns for the LX node voltage without compensation current (i.e., $I_1=0$). Waveform 310 in the upper panel shows the voltage level (Vvlx) at the LX node. Waveform 320 in the middle panel shows the resulting parasitic current I(set) that flows through first transistor device 10. Waveform 330 in the lower panel shows the voltage drop V(SET,Vlx) at the input of the latch 50. As can be seen from these waveforms, the current Iset, which is equal to current $I_3$ and $I_2$ caused by the parasitic capacitance $C_{par,1}$ is high enough to pull down the voltage at the intermediate node 70 (Vset), which will cross the threshold voltage of approximately 1.3 V for the SR-latch 50 and thereby cause a false trigger of the gate drive signal for the high-side switch 40.

Figure 4A:
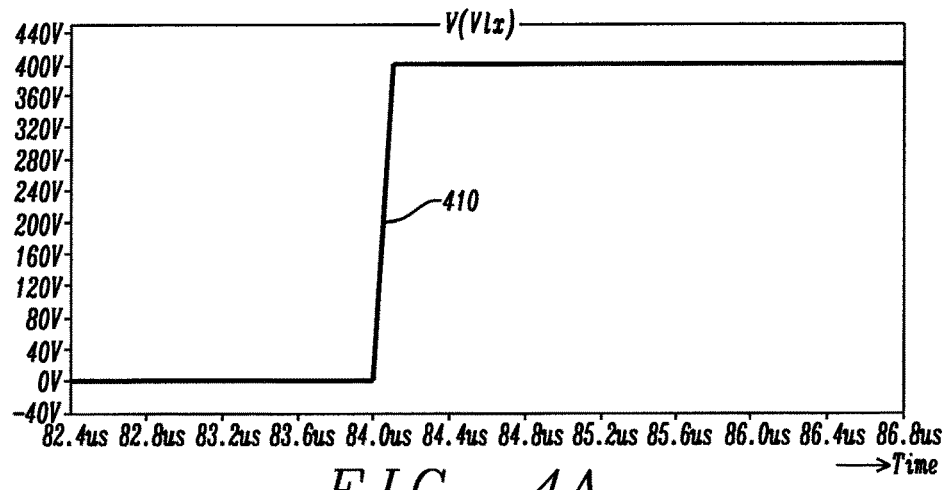
Figure 4B:
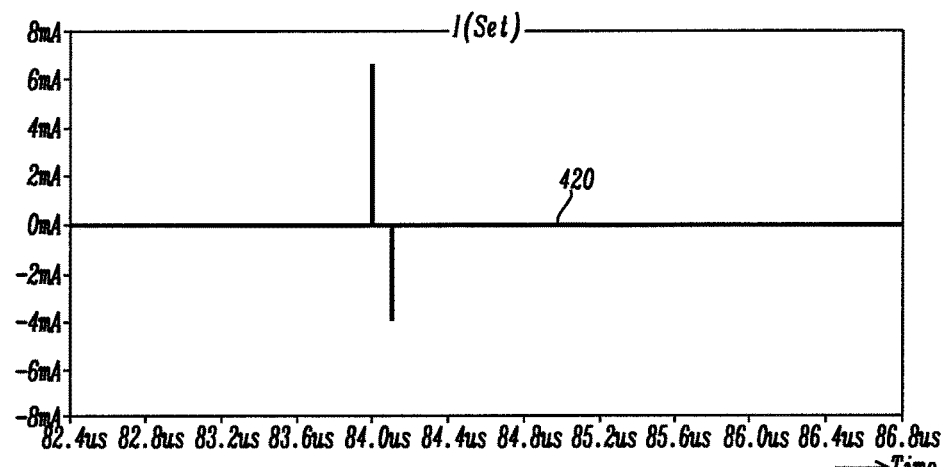
Figure 4C:
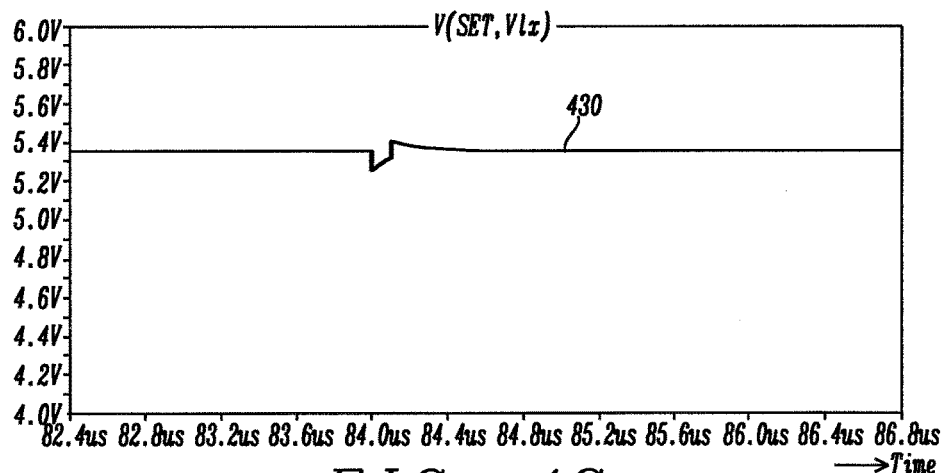

FIGS. 4A, 4B and 4C are diagrams schematically illustrating an example of the impact of a voltage change at the output node of the half bridge circuit 200 of FIG. 2, and thus shows the effect of the compensation circuit. Waveform 410 in the upper panel shows the voltage level (Vvlx) at the LX node. Waveform 420 in the middle panel shows the resulting parasitic current I(set) that flows through first transistor device 10. Waveform 430 in the lower panel shows the voltage drop V(SET,Vlx) at the input of the latch 50. The setup is the same as for FIGS. 3A, 3B and 3C, but now for non-zero compensation current $I_1$. Since the compensation current $I_1$ is (approximately) equal to the parasitic current $I_3$, but with opposite sign, $I_1 \approx -I_3$, the resulting current $I_2$ and voltage drop at the intermediate node 70 is very small and offers a high margin towards the 1.3 V threshold voltage of the RS-latch 50.

Figure 5:
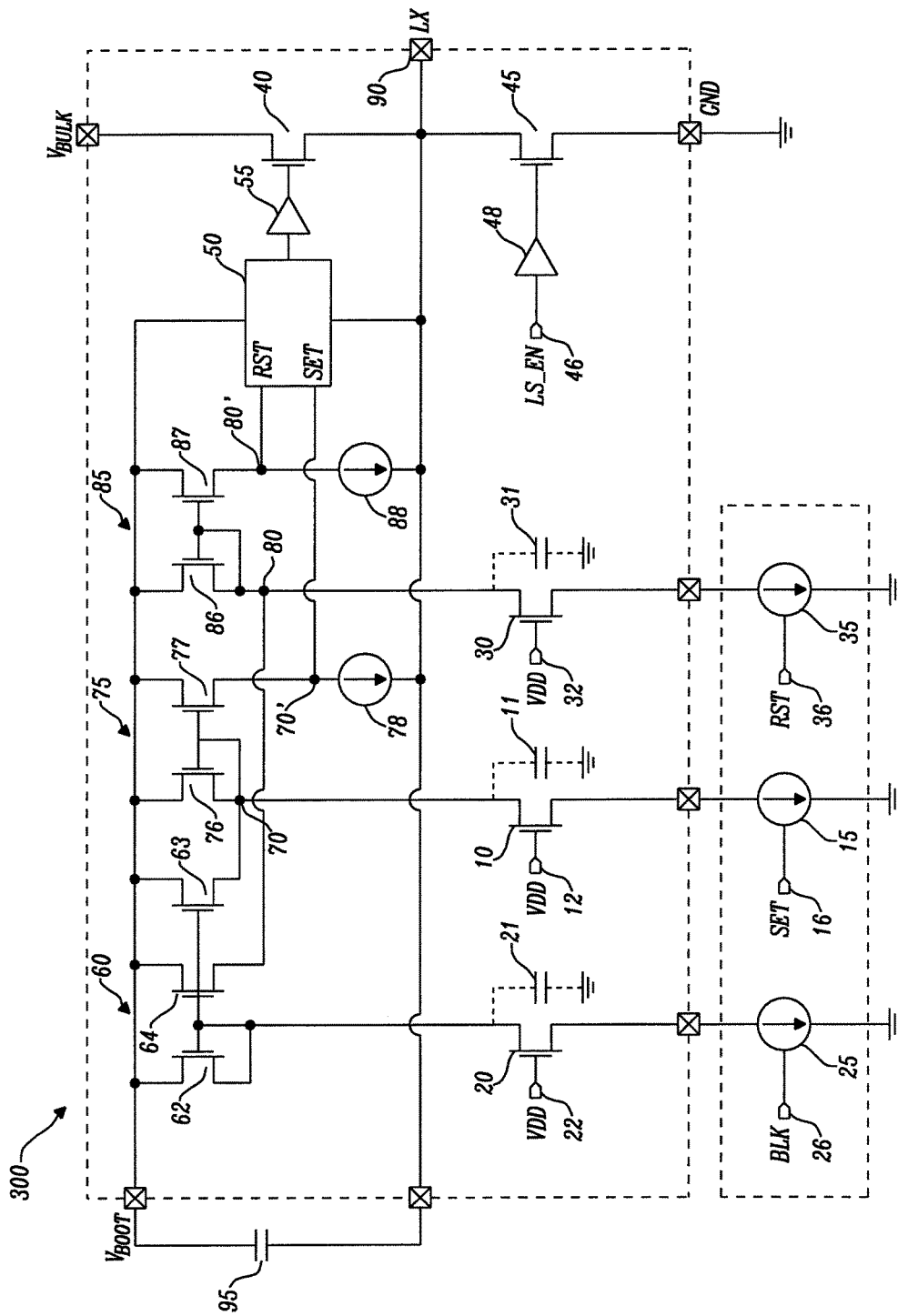

FIG. 5 schematically illustrates another example of a half bridge circuit 300 according to embodiments of the disclosure. This figure shows the basic implementation of the complete circuit with current sinks, level shifters, compensation circuit, half-bridge logic, and half-bridge.

The half bridge circuit 300 is identical to the half bridge circuit 200 in FIG. 2, with the exception that the impedances 72, 82 (e.g., resistances, or pull-up resistances) have been replaced by respective pull-up current mirrors 75, 85. Accordingly, the half bridge circuit 300 comprises a pull-up current mirror 75 (for the set signal path) that includes a pair of gate-connected transistors 76, 77. A first transistor 76 of the pair is coupled between the supply voltage level and the (first) intermediate node 70. A second transistor 77 of the pair is coupled in series with a current source 78 between the supply voltage level and the output node 90. A second intermediate node 70' between the second transistor 77 of the pair and the current source 78 is coupled to the (first) input of the latch 50. The pull-up current mirror 75 generates a voltage drop at the (first) input of the latch 50 in accordance with (e.g., in dependence on) the current flowing through the first transistor device 10. The half bridge circuit 400 further comprises an analogous structure of a pull-up current mirror 85 (with gate-connected transistors 86, 87) and current source 88 for the reset signal path, wherein an intermediate node 80' between transistor 87 and current source 88 is coupled to the other (second) input of the latch 50, as shown in FIG. 5. Compensation of parasitic currents proceeds in the same manner as in the half bridge circuit 200 of FIG. 2.

Figure 6:
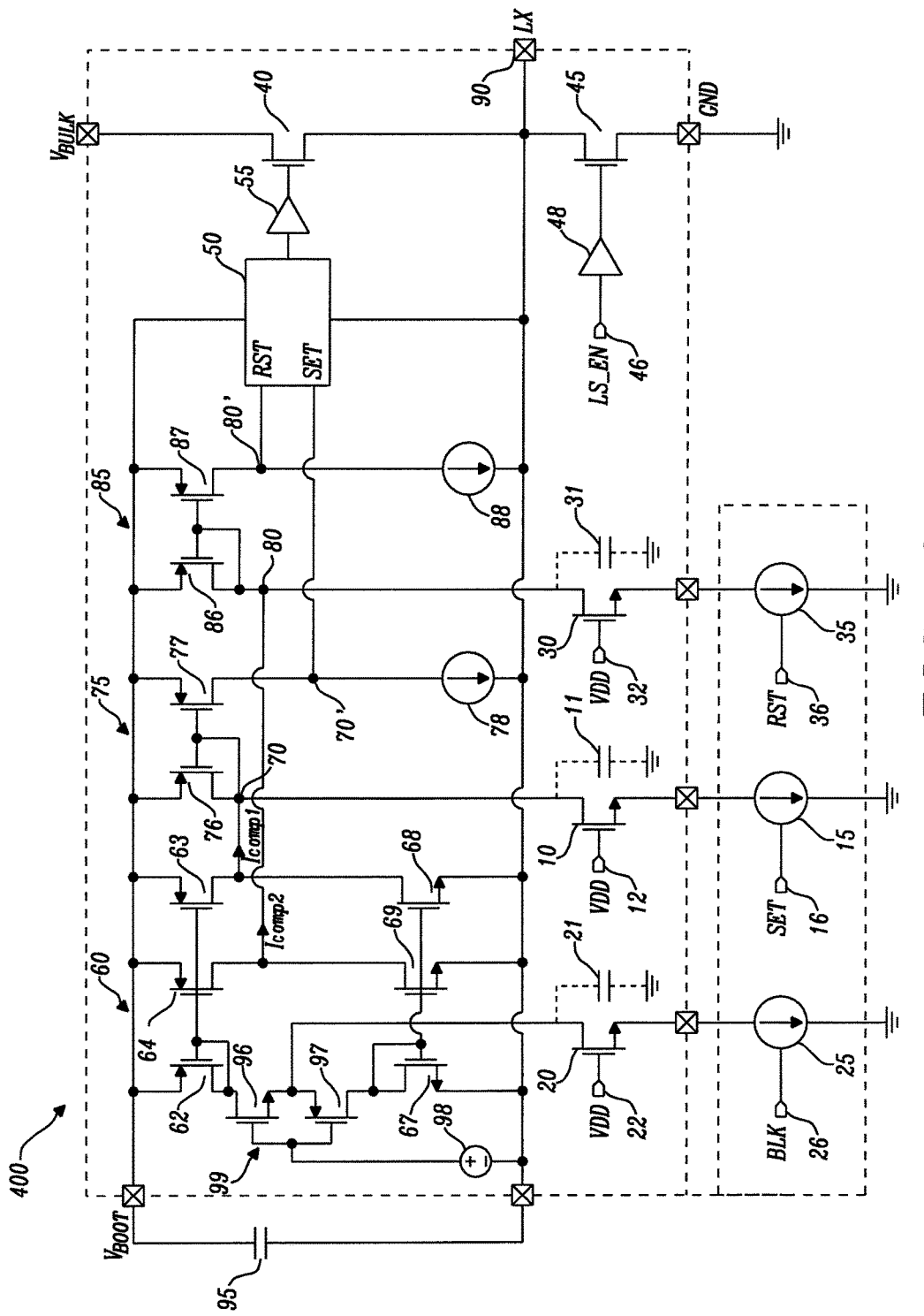

FIG. 6 schematically illustrates another example of a half bridge circuit 400 according to embodiments of the disclosure. The half bridge circuit 400 differs from the half bridge circuit 300 in FIG. 5 in that it includes a compensation circuit for bidirectional compensation, i.e., for compensating both positive and negative parasitic currents.

As described above, the positive voltage change dVlx/dt on the LX node is the most critical system operation influenced by parasitic capacitance. Nevertheless, it may be desirable to compensate also for negative voltage change dVlx/dt at the LX node. This can be realized by the half bridge circuit 400 of FIG. 6.

The half bridge circuit 400 comprises the current mirror 60 as a first current mirror. This first current mirror 60 now has the purpose of mirroring the current that flows through the second transistor device 20 in case of a positive polarity of that current. The first current mirror 60 may include gate-connected PMOS transistors, for example. The half bridge circuit also comprises the aforementioned circuit path as a first circuit path for feeding the mirrored current of the first current mirror 60 to the (first) intermediate node 70 between the supply voltage level and the first transistor device 10. In addition to the first current mirror 60, the half bridge circuit 400 further comprises a second current mirror 65 for mirroring the current that flows through the second transistor device 20 in case of a negative polarity of that current, and a second circuit path for feeding the mirrored current of the second current mirror 65 to the (first) intermediate node 70 between the supply voltage level and the first transistor device 10. The second current mirror 65 may include gate-connected NMOS transistors, for example. The half bridge circuit 400 further comprises a switching means 99 for selectively activating the first current mirror 60 or the second current mirror 65, depending on the polarity of the current that flows through the second transistor device 20. That is, for positive polarity of the current, the first current mirror 60 will be activated, and for negative polarity of the current, the second current mirror 65 will be activated. The first and second current mirrors 60, 65 may implement a positive and negative capacitive current source, respectively, for the bidirectional compensation of the parasitic current.

In the example of FIG. 6, The switching means 99 includes a pair of transistors 96, 97, one PMOS transistor 97 and one NMOS transistor 96. A source (source terminal) of one of them may be coupled to a drain (drain terminal) of the other one of them. The source and the drain may be coupled to a supply voltage side of the second transistor device 20. Gates of the transistors 96, 97 of the switching means 99 are coupled to the LX node through a reference voltage source 98. A voltage that is applied by the reference voltage source 98 may correspond to half the supply voltage level ($V_{BOOT}$), i.e., to $V_{BOOT}/2$. The first current mirror 60, the switching means 99, and the second current mirror 65 are coupled in series between the supply voltage level and the LX node. Depending on the current direction, one of the transistors 96, 97 of the switching means 99 will be active. The voltage on the parasitic capacitance ($C_{par,2}$) 21 of the second transistor device 20 then is approximately defined by the reference voltage that is applied by the reference voltage source 98, which may be typically set to $V_{BOOT}/2$ (where $V_{BOOT}$ is a voltage relative to the LX node). Depending on the sign of dVlx/dt the current will be mirrored to the output in both directions by the bidirectional compensation currents $I_{comp1}$ and $I_{comp2}$.

In analogy to the implementations of FIG. 2 and FIG. 5, the first and second current mirrors 60, 65 may each comprise one input transistor (transistors 62, 67) and two output transistors (transistors 63, 64 for the first current mirror 60 and transistors 68, 69 for the second current mirror 65) for providing compensation currents for both the set control path and the reset control path.

The compensation circuit (the second transistor device 20, its current source 25, the first and second current mirrors 60, 65 and the switching means 99) of the half bridge circuit 400 compensates for the influence of the parasitic capacitive current during the rising and falling edge of the LX node with bidirectional compensation currents.

Although the half bridge circuit 400 includes the pull-up current mirrors 75, 85, the present disclosure likewise applies to a half bridge circuit having bidirectional compensation that includes impedances (e.g., resistances, or pull-up resistances) in place of the pull-up current mirrors, as is illustrated, for example in FIG. 2.

Figure 7:
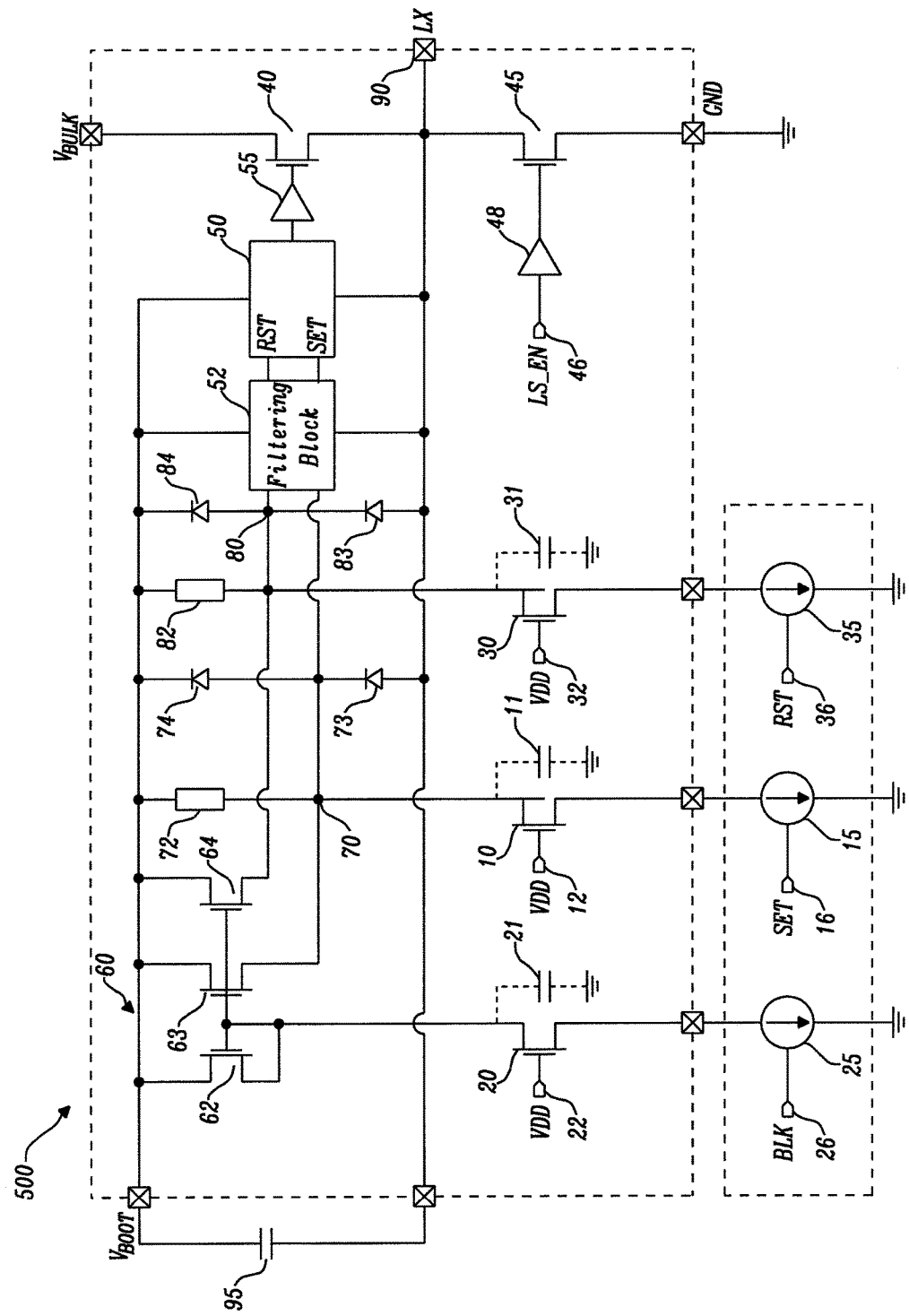

FIG. 7 schematically illustrates yet another example of a half bridge circuit 500 according to embodiments of the disclosure. The half bridge circuit 500 is identical to the half bridge circuit 200 of FIG. 2 except for that is comprises a filtering block 52 for applying common mode rejection and/or filtering to the voltage levels at the two inputs of the latch 50. The filtering block 52 may be configured to apply common-mode rejection and/or transient spike filter to the incoming signals for the set and reset control signals. The added differential stage in the filter block 52 may reject residual common-mode noise caused by mismatches between the output transistors 63, 64 of the first current mirror 60 (and likewise, if present, between the output transistors 68, 69 of the second current mirror 65) and between the impedances 72, 82.

Although the half bridge circuit 500 includes the impedances 72, 82 (e.g., resistances, or pull-up resistances), the present disclosure likewise applies to a half bridge circuit with filtering block that includes pull-up current mirrors in place of the impedances, as is illustrated, for example in FIG. 5.

As noted above, as an option the current source 25 of the compensation circuit can be controlled by the external signal BLK 26. In this case the additional compensation current will have a blanking effect on the set and reset control signals. This would be useful during the rising edge of the LX node, as this is a most critical phase in the operation. Also a constant very low current might be applied help to protect the system from fault triggering. These statements hold true for any of the above implementations of the half bridge circuit according to embodiments of the disclosure.

Figure 8:
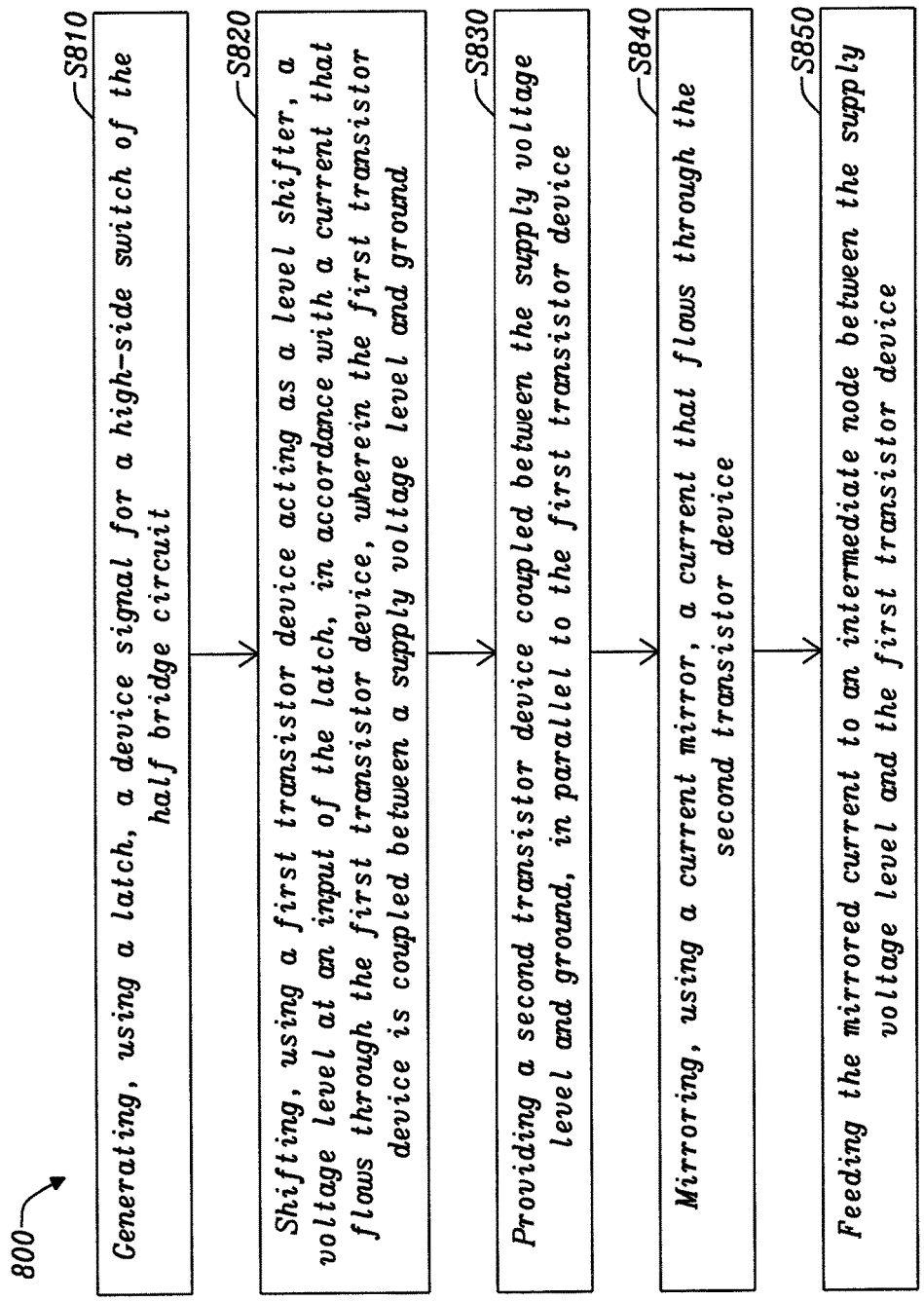
FIG. 8 is a flowchart schematically illustrating a method of operating a half bridge circuit according to embodiments of the disclosure.

The present disclosure likewise relates to a method of operating a half bridge circuit, for example any of the half bridge circuits described above. An example of such method 800 according to embodiments of the disclosure is illustrated in the flowchart of FIG. 8. Method 800 is understood to be likewise applicable to a switching mode power converter as an example of a half bridge circuit.

At step S810, a drive signal for a high-side switch of the half bridge circuit is generated, using a latch. At step S820, a voltage level at an input of the latch is shifted, using a first transistor device acting as a level shifter, in accordance with a current that flows through the first transistor device. The first transistor device is coupled between a supply voltage level and ground. At step S830, a second transistor device is provided, coupled between the supply voltage level and ground in parallel to the first transistor device. At step S840, a current that flows through the second transistor device is mirrored, using a current mirror. At step S850, the mirrored current is fed to an intermediate node between the supply voltage level and the first transistor device.

It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above, and/or to providing and/or arranging respective elements of these circuits.

In the above, reference is made to a half bridge circuit and its implementations. As a switching mode power converter can be seen as an example of a half bridge circuit, the present disclosure should be understood to likewise apply to a switching mode power converter and a method of operating a switching mode power converter.

In the above, reference is made to level shifters that lower the voltage level at the inputs of the latch. These level shifters may be implemented by NMOS transistors, for example. However, the present disclosure is likewise applicable to level shifters that raise the voltage level at the inputs of the latch. Such level shifters may be implemented by PMOS transistors, for example. Respective implementations of half-bridge circuit including such level shifters could be obtained from the half-bridge circuits described above by a simple mirroring operation, as the skilled person will appreciate.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A half bridge circuit, comprising:
   a high-side switch;
   a latch for providing a drive signal for the high-side switch;
   a first transistor device acting as a level shifter for shifting a voltage level at an input of the latch, wherein the first transistor device is coupled between a supply voltage level and ground, and wherein the voltage level at the input of the latch is shifted in accordance with a current that flows through the first transistor device;
   a second transistor device coupled between the supply voltage level and ground, in parallel to the first transistor device;
   a current mirror for mirroring a current that flows through the second transistor device;
   a circuit path for feeding a mirrored current to an intermediate node between the supply voltage level and the first transistor device; and
   a pull-up current mirror that includes a pair of gate-connected transistors,
   wherein a first transistor of the pair is coupled between the supply voltage level and the intermediate node and a second transistor of the pair is coupled in series with a current source between the supply voltage level and an output node of the half bridge circuit, wherein a second intermediate node between the second transistor of the pair and the current source is coupled to the input of the latch.

2. The half bridge circuit according to claim 1, wherein the second transistor device has a same size as the first transistor device.

3. The half bridge circuit according to claim 1, wherein the current mirror has a mirror ratio greater than or equal to one.

4. The half bridge circuit according to claim 1, wherein a mirror ratio of the current mirror multiplied by a ratio of a parasitic capacitance of the second transistor device over a parasitic capacitance of the first transistor device is greater than or equal to one.

5. The half bridge circuit according to claim 1, wherein the second transistor device is driven to be switched OFF.

6. The half bridge circuit according to claim 1, further comprising an impedance coupled between the supply voltage level and the intermediate node between the supply voltage level and the first transistor device,
   wherein the intermediate node is coupled to the input of the latch.

7. A half bridge circuit, comprising:
   a high-side switch;
   a latch for providing a drive signal for the high-side switch;
   a first transistor device acting as a level shifter for shifting a voltage level at an input of the latch, wherein the first transistor device is coupled between a supply voltage level and ground, and wherein the voltage level at the input of the latch is shifted in accordance with a current that flows through the first transistor device;
   a second transistor device coupled between the supply voltage level and ground, in parallel to the first transistor device;
   a current mirror for mirroring a current that flows through the second transistor device; and
   a circuit path for feeding a mirrored current to an intermediate node between the supply voltage level and the first transistor device,
   wherein the current mirror is a first current mirror for mirroring the current that flows through the second transistor device in case of a positive polarity of that current and the circuit path is a first circuit path for feeding the mirrored current of the first current mirror to the intermediate node between the supply voltage level and the first transistor device; and
   the half bridge circuit further comprises:
   a second current mirror for mirroring the current that flows through the second transistor device in case of a negative polarity of that current and a second circuit path for feeding the mirrored current of the second current mirror to the intermediate node between the supply voltage level and the first transistor device; and
   a switching means for selectively activating the first current mirror or the second current mirror, depending on the polarity of the current that flows through the second transistor device.

8. A half bridge circuit, comprising:
   a high-side switch;
   a latch for providing a drive signal for the high-side switch;
   a first transistor device acting as a level shifter for shifting a voltage level at an input of the latch, wherein the first transistor device is coupled between a supply voltage level and ground, and wherein the voltage level at the input of the latch is shifted in accordance with a current that flows through the first transistor device;
a second transistor device coupled between the supply voltage level and ground, in parallel to the first transistor device;
a current mirror for mirroring a current that flows through the second transistor device;
a circuit path for feeding a mirrored current to an intermediate node between the supply voltage level and the first transistor device; and
a third transistor device acting as a level shifter for shifting a voltage level at a second input of the latch, wherein the third transistor device is coupled between the supply voltage level and ground, and wherein the voltage level at the second input of the latch is shifted in accordance with a current that flows through the third transistor device,
wherein the current mirror comprises two output transistors, each of which conducts the mirrored current;
wherein the circuit path is coupled to a first one of the output transistors;
wherein the half bridge circuit further comprises a second circuit path for feeding the mirrored current to a third intermediate node between the supply voltage level and the third transistor device; and
wherein the second circuit path is coupled to a second one of the output transistors.

9. The half bridge circuit according to claim 8, further comprising a filtering block for applying common mode rejection and/or filtering to the voltage levels at the two inputs of the latch.

10. A method of operating a half bridge circuit, the method comprising the steps of:
generating, using a latch, a drive signal for a high-side switch of the half bridge circuit;
shifting, using a first transistor device acting as a level shifter, a voltage level at an input of the latch, in accordance with a current that flows through the first transistor device, wherein the first transistor device is coupled between a supply voltage level and ground;
providing a second transistor device coupled between the supply voltage level and ground, in parallel to the first transistor device;
mirroring, using a current mirror, a current that flows through the second transistor device;
feeding a mirrored current to an intermediate node between the supply voltage level and the first transistor device;
providing a pull-up current mirror that includes a pair of gate-connected transistors, wherein a first transistor of the pair is coupled between the supply voltage level and the intermediate node and a second transistor of the pair is coupled in series with a current source between the supply voltage level and an output node of the half bridge circuit; and
coupling a second intermediate node between the second transistor of the pair and the current source to the input of the latch.

11. The method according to claim 10, wherein the second transistor device has a same size as the first transistor device.

12. The method according to claim 10, wherein the current mirror has a mirror ratio greater than or equal to one.

13. The method according to claim 10, wherein a mirror ratio of the current mirror multiplied by a ratio of a parasitic capacitance of the second transistor device over a parasitic capacitance of the first transistor device is greater than or equal to one.

14. The method according to claim 10, further comprising driving the second transistor device to be switched OFF.

15. The method according to claim 10, further comprising the steps of:
coupling an impedance between the supply voltage level and the intermediate node between the supply voltage level and the first transistor device; and
coupling the intermediate node to the input of the latch.

16. A method of operating a half bridge circuit, the method comprising the steps of:
generating, using a latch, a drive signal for a high-side switch of the half bridge circuit;
shifting, using a first transistor device acting as a level shifter, a voltage level at an input of the latch, in accordance with a current that flows through the first transistor device, wherein the first transistor device is coupled between a supply voltage level and ground;
providing a second transistor device coupled between the supply voltage level and ground, in parallel to the first transistor device;
mirroring, using a current mirror, a current that flows through the second transistor device; and
feeding a mirrored current to an intermediate node between the supply voltage level and the first transistor device, wherein
the current mirror is provided as a first current mirror for mirroring the current that flows through the second transistor device in case of a positive polarity of that current and the circuit path is provided as a first circuit path for feeding the mirrored current of the first current mirror to the intermediate node between the supply voltage level and the first transistor device; and
the method further comprises the steps of:
providing a second current mirror for mirroring the current that flows through the second transistor device in case of a negative polarity of that current and a second circuit path for feeding the mirrored current of the second current mirror to the intermediate node between the supply voltage level and the first transistor device; and
selectively activating the first current mirror or the second current mirror, depending on the polarity of the current that flows through the second transistor device.

17. A method of operating a half bridge circuit, the method comprising the steps of:
generating, using a latch, a drive signal for a high-side switch of the half bridge circuit;
shifting, using a first transistor device acting as a level shifter, a voltage level at an input of the latch, in accordance with a current that flows through the first transistor device, wherein the first transistor device is coupled between a supply voltage level and ground;
providing a second transistor device coupled between the supply voltage level and ground, in parallel to the first transistor device;
mirroring, using a current mirror, a current that flows through the second transistor device; and
feeding a mirrored current to an intermediate node between the supply voltage level and the first transistor device,
wherein the current mirror comprises two output transistors, each of which conducts the mirrored current; and
the method further comprises the steps of:
shifting, using a third transistor device acting as a level shifter, a voltage level at a second input of the latch, in accordance with a current that flows through the third transistor device, wherein the third transistor device is coupled between the supply voltage level and ground, coupling the circuit path to a first one of the output transistors;

providing a second circuit path for feeding the mirrored current to a third intermediate node between the supply voltage level and the third transistor device; and coupling the second circuit path to a second one of the output transistors.

18. The method according to claim 17, further comprising the steps of:

applying, using a filtering block, common mode rejection and/or filtering to the voltage levels at the two inputs of the latch.

\* \* \* \* \*